(12) United States Patent
Akamatsu

(10) Patent No.: US 9,534,888 B2
(45) Date of Patent: Jan. 3, 2017

(54) DETECTION APPARATUS, MEASUREMENT APPARATUS, EXPOSURE APPARATUS, METHOD OF MANUFACTURING ARTICLE, AND MEASUREMENT METHOD

(71) Applicant: CANON KABUSHIKI KAISHA, Tokyo (JP)

(72) Inventor: Akio Akamatsu, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 14/840,400

(22) Filed: Aug. 31, 2015

(65) Prior Publication Data

US 2016/0070175 A1 Mar. 10, 2016

(30) Foreign Application Priority Data

Sep. 5, 2014 (JP) ................. 2014-181599

(51) Int. Cl.
  *G03B 27/42* (2006.01)
  *G03B 27/52* (2006.01)
  *G01B 11/27* (2006.01)
  *G03F 9/00* (2006.01)

(52) U.S. Cl.
  CPC ........... *G01B 11/272* (2013.01); *G03F 9/7088* (2013.01)

(58) Field of Classification Search
  CPC ....... G01B 11/272; G01B 11/24; G01B 11/27; G01B 11/002; G01B 2210/56; G03F 7/70633; G03F 9/7088; G03F 7/70141; G03F 7/70683; G03F 9/7011; G03F 9/7046; G03F 1/42; G03F 9/7015; G03F 9/7069; G03F 7/70775; G03F 9/7038; G03F 9/7076; G02B 21/361
  See application file for complete search history.

(56) References Cited

FOREIGN PATENT DOCUMENTS

JP 63032303 A 2/1988

*Primary Examiner* — Mesfin Asfaw
(74) *Attorney, Agent, or Firm* — Rossi, Kimms & McDowell LLP

(57) ABSTRACT

The present invention provides a detection apparatus which detects an original mark on an original and a substrate mark on a substrate, the original mark and the substrate mark being arranged via a projection optical system, the apparatus comprising an optical system including an imaging device and configured to form an image of the original mark and an image of the substrate mark onto the imaging device, wherein the optical system includes a detection reference member having a first mark and a second mark, and is configured to form an image of the first mark onto the original, form an image of the second mark onto the substrate via the projection optical system and the original, and form the image of the first mark, and the image of the second mark onto the imaging device.

13 Claims, 6 Drawing Sheets

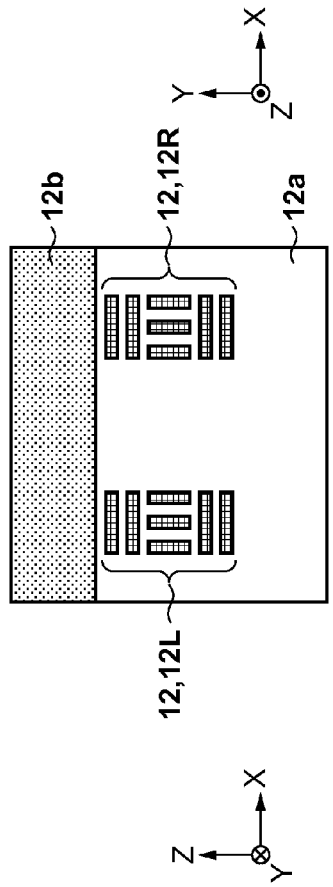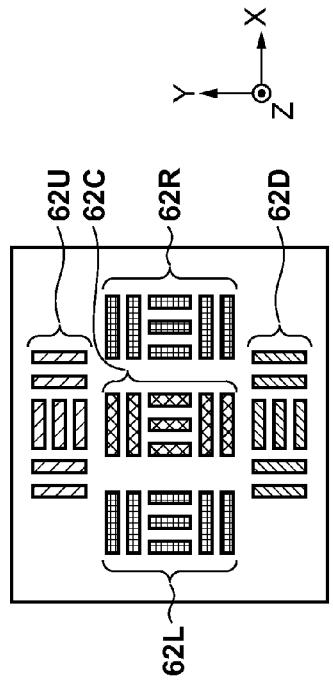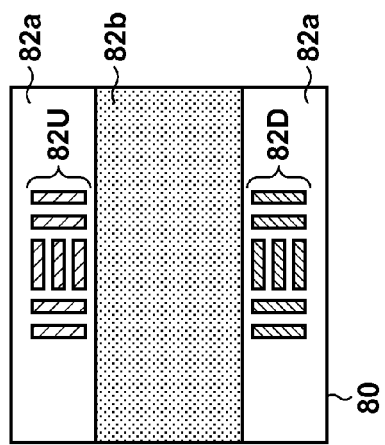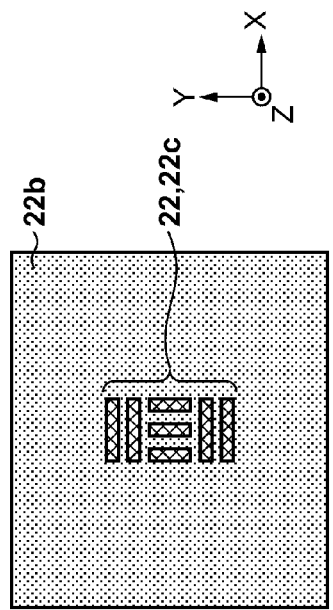

DETECTION APPARATUS, MEASUREMENT APPARATUS, EXPOSURE APPARATUS, METHOD OF MANUFACTURING ARTICLE, AND MEASUREMENT METHOD

BACKGROUND OF THE INVENTION

Field of the Invention

The present invention relates to a detection apparatus which detects a mark related to alignment between an original and a substrate, a measurement apparatus, an exposure apparatus, a method of manufacturing an article, and a measurement method.

Description of the Related Art

One of apparatuses used in the manufacturing process (lithography process) of a semiconductor device or the like is an exposure apparatus which transfers the patterns of a mask to a substrate via a projection optical system. The exposure apparatus is required to accurately align the mask and the substrate to transfer, at high overlay precision, the pattern of the mask to each of a plurality of shot regions formed on the substrate. Japanese Patent Laid-Open No. 63-32303 proposes a method of detecting the position of each mark provided on a substrate by using a TTL (Through The Lens) method, and aligning a mask and the substrate based on the detection result. The TTL method is a method of detecting the marks on the substrate via the mask and a projection optical system.

While detecting the plurality of marks on the substrate by the TTL method and obtaining information about arrangement of the plurality of shot regions formed on the substrate, the state of the projection optical system can fluctuate due to, for example, a change in temperature inside the projection optical system, the vibrations of optical members, or the like. In this case, the states of the projection optical system when detecting the plurality of marks on the substrate are different. As a result, the information about arrangement of the shot regions cannot be obtained accurately, making it difficult to accurately align the masks and the substrate when exposing the substrate.

SUMMARY OF THE INVENTION

The present invention provides, for example, a technique advantageous in overlay precision.

According to one aspect of the present invention, there is provided a detection apparatus which detects an original mark on an original or an original reference member and a substrate mark on a substrate or a substrate reference member, the original mark and the substrate mark being arranged via a projection optical system, the apparatus comprising: an optical system including an imaging device and configured to form an image of the original mark and an image of the substrate mark onto the imaging device, wherein the optical system includes a detection reference member having a first mark and a second mark, and is configured to: form an image of the first mark onto the original or the original reference member, and form an image of the second mark onto the substrate or the substrate reference member via the projection optical system and the original or the original reference member, and form an image of the original mark, an image of the substrate mark, the image of the first mark, and the image of the second mark onto the imaging device.

Further features of the present invention will become apparent from the following description of exemplary embodiments with reference to the attached drawings.

BRIEF DESCRIPTION OF THE DRAWINGS

FIG. 2A is a view showing respective marks on a reference plate;

FIG. 2B is a view showing mask marks;

FIG. 2C is a view showing substrate marks;

FIG. 2D is a view showing an image obtained by an imaging device;

DESCRIPTION OF THE EMBODIMENTS

Figure 1:
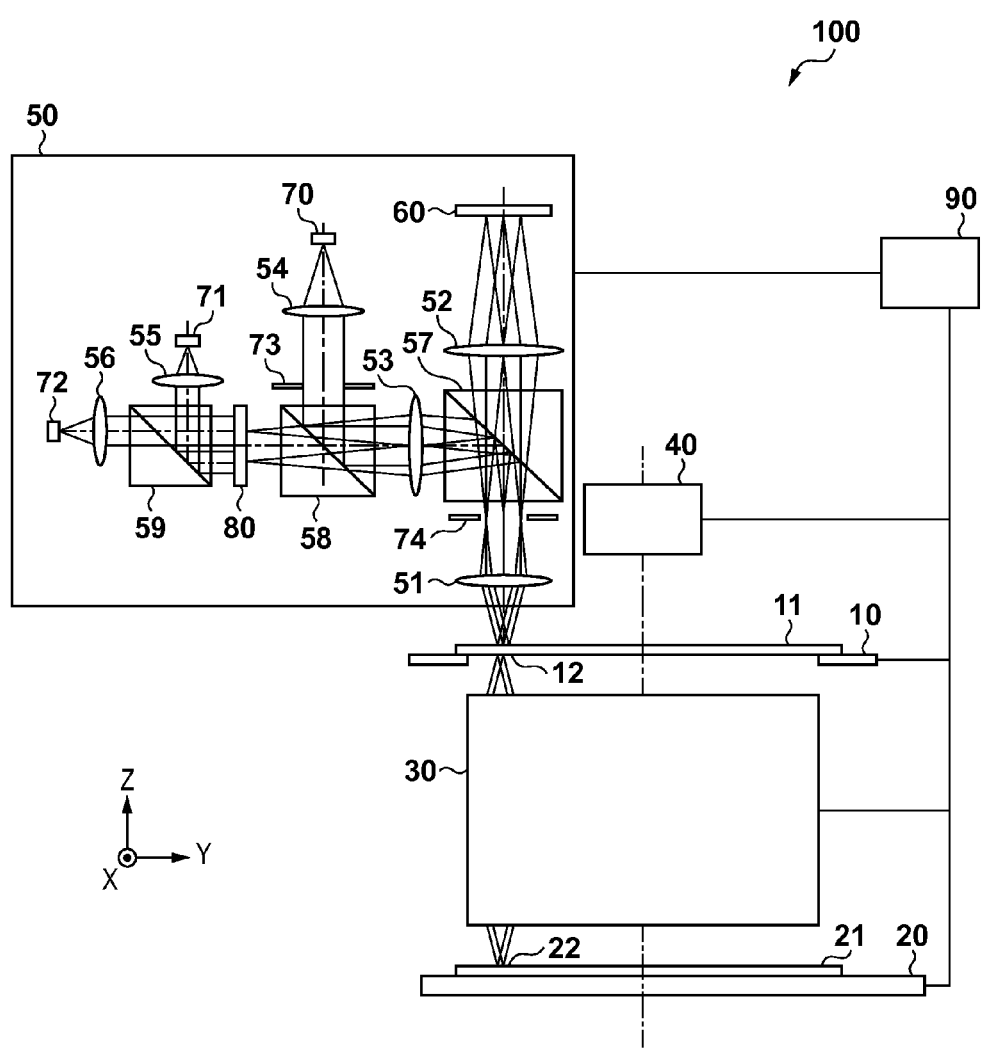
FIG. 1 is a schematic view showing the arrangement of an exposure apparatus according to the first embodiment.

Exemplary embodiments of the present invention will be described below with reference to the accompanying drawings. Note that the same reference numerals denote the same members throughout the drawings, and a repetitive description thereof will not be given. The present invention is effective especially when using a projection optical system with the proportion of an optical path length in air to a total optical path length, such as a projection optical system (for example, an Offner optical system or a Dyson optical system) having a reflection portion.

First Embodiment

An exposure apparatus 100 according to the first embodiment of the present invention will be described with reference to FIG. 1. FIG. 1 is schematic view showing the arrangement of the exposure apparatus 100 according to the first embodiment. In the first embodiment, a step & scan type exposure apparatus which scans and exposes a substrate with slit light will be described. However, the present invention is not limited to this but can also be applied to, for example, a step & repeat type exposure apparatus. The exposure apparatus 100 according to the first embodiment can include, for example, a mask stage 10, a substrate stage 20, a projection optical system 30, an illumination optical system 40, a detection unit 50 (detection apparatus), and a controller 90. The controller 90 includes, for example, a CPU and a memory, and controls a process of transferring, via the projection optical system 30, the pattern of a mask 11 to each of a plurality of shot regions formed on a substrate 21 (a process of exposing the substrate 21).

Light emitted from a light source (not shown) is incident on the illumination optical system 40 and forms, on the mask, a long band-like or an arcuate slit-shaped exposure area in, for example, the X direction. The mask 11 (original) and the substrate (for example, a glass plate) are held by the mask stage 10 and the substrate stage 20 respectively, and are arranged in almost optically conjugate positions (the object plane and the image plane of the projection optical system 30) via the projection optical system 30. The projection optical system 30 has, for example, a predetermined projection magnification (for example, ×1 or ×½), and projects the pattern formed on the mask 11 onto the substrate 21. The mask stage 10 and the substrate stage 20 scan at a velocity ratio corresponding to the projection magnification of the projection optical system 30 in synchronism with each other in a direction (Y direction in the first embodiment) perpendicular to the optical axis direction (Z direction) of the projection optical system 30. This makes it possible to transfer the pattern formed on the mask 11 to each shot region on the substrate. By repeating this scanning exposure with respect to each of the plurality of shot regions on the substrate while moving the substrate stage 20 step by step, exposure processing on the one substrate 21 can be completed.

In the exposure apparatus 100, alignment between the mask 11 and the substrate 21 is performed based on information about arrangement of the plurality of shot regions on the substrate when transferring the pattern of the mask 11 to each shot region on the substrate. This information about arrangement of the shot regions can be acquired in advance by obtaining the positions of the marks respectively provided in several shot regions (sample shot regions) on the substrate before starting exposure of the substrate 21. Therefore, the exposure apparatus 100 includes the detection unit 50 (detection apparatus) which detects the marks on the substrate by using a TTL method. The TTL method is a method of detecting the marks on the substrate via the mask and the projection optical system 30. That is, the detection unit 50 detects the positions of the marks on the mask, and the positions of the marks on the substrate via the mask and the projection optical system. This allows the controller 90 to obtain, based on the detection results by the detection unit 50, the relative positions (in the XY direction) of the marks on the mask and the marks on the substrate. The detection unit 50 and the controller 90 can form a measurement apparatus which measures the relative positions of the marks on the mask and the marks on the substrate. In the following description, the marks on the mask will be referred to as mask marks 12 (original marks) and the marks on the substrate will be referred to as substrate marks 22.

As shown in FIG. 1, the detection unit 50 can include, for example, an objective lens 51, relay lenses 52 and 53, an illumination system lens 54, beam splitters 57 and 58, an imaging device 60, a light source 70, a field stop 73, and an objective aperture 74. Light emitted from the light source 70 is converted into parallel light by the illumination system lens 54, and then passes through the field stop 73 and is reflected by the beam splitter 58. Light reflected by the beam splitter 58 passes through the relay lens 53 and is reflected by the beam splitter 57. Light reflected by the beam splitter 57 passes through the objective aperture 74 and the objective lens 51, illuminates the mask marks 12, and illuminates the substrate marks 22 via the projection optical system.

Examples of the arrangements of the mask marks 12 and the substrate marks 22 will now be described. FIGS. 2B and 2C respectively show the examples of the mask marks 12 and the substrate marks 22. As shown in FIG. 2B, the mask marks 12 can be formed by light-shielding members (for example, Cr films) which shield light in, for example, a partial region (light-transmitting region 12a) on the mask made of a light-transmitting member (for example, a glass member) which transmits light. The mask marks 12 according to the first embodiment include patterns 12R and 12L formed by the light-shielding members. On the mask, a light-shielding region 12b where the images of first marks 82U to be described later are formed is provided in the +Y direction of the mask marks 12. Like the mask marks 12, the light-shielding region 12b is made of the light-shielding member which shields light. On the other hand, as shown in FIG. 2C, the substrate marks 22 are formed so as to transmit light by, for example, removing parts of a light-shielding member (light-shielding region 22b) which is provided on the substrate made of the light-transmitting member (for example, the glass member) transmitting light. The substrate marks 22 according to the first embodiment can include a pattern 22c formed by removing the light-shielding member.

The imaging device 60 captures the mask marks 12 and the substrate marks 22 via an optical system formed by the relay lens 52, the beam splitter 57, the objective aperture 74, and the objective lens 51. For example, if the mask marks 12 and the substrate marks 22 have the above-described arrangements, the imaging device 60 captures the substrate marks 22 and the mask marks 12 projected onto the substrate via the projection optical system 30 simultaneously (in parallel). For this reason, light reflected by the mask marks 12 may be inhibited from being incident on the imaging device 60. Therefore, the beam splitter 57 may have a function of a polarization beam splitter for the wavelength of the light source 70, and the projection optical system 30 may have a function of shifting the phase of light emitted from the light source 70. This makes it possible to reflect light reflected by the mask marks 12 by the beam splitter 57 and inhibit the light from being incident on the imaging device 60. A method of providing the projection optical system 30 with the function of shifting the phase of light includes, for example, a method of arranging a $\lambda/4$ plate or a phase film on an optical path inside the projection optical system 30.

As described above, the exposure apparatus 100 can obtain information about arrangement of the plurality of shot regions formed on the substrate 21 by sequentially measuring the relative positions of the plurality of substrate marks 22 and the corresponding mask marks 12. While the detection unit 50 detects the plurality of substrate marks 22 in order to obtain the information about arrangement of the shot regions, however, the state of the projection optical system 30 can fluctuate due to, for example, a change in temperature inside the projection optical system 30, the vibrations of optical members, or the like. For example, when performing an exposure step on each of the plurality of substrates 21, a step of obtaining information about arrangement of the shot regions for the nth substrate 21 is performed between the exposure step of the nth substrate 21 and that of the (n−1)th substrate 21. In this case, the step of obtaining the information about arrangement of the shot regions for the nth substrate 21 is performed in a state in which the temperature inside the projection optical system 30 fluctuates (lowers) as compared with a time when the exposure step of the (n−1)th substrate 21 ends. That is, a refractive index changes inside the projection optical system 30 and the states of the projection optical system 30 when detecting the plurality of substrate marks 22 respectively can be different. As a result, errors which occur in the measurement results of the relative positions may differ from each other in the plurality of substrate marks 22, making it difficult to accurately obtain the information about arrangement of the shot regions.

The exposure apparatus 100 according to the first embodiment includes, in the detection unit 50, a reference plate 80 (detection reference member) on which the first marks 82U (first reference marks) whose images are formed on the mask and second marks 82D (second reference marks) whose images are formed on the substrate are formed. The exposure apparatus 100 obtains, based on the first marks 82U whose images have been formed on the mask and the second marks 82D whose images have been formed on the substrate, the relative positions of the mask marks 12 and the substrate marks 22 under the assumption that the state of the projection optical system 30 is constant. First, the arrangement of the detection unit 50 according to the first embodiment will be described. In addition to the above-described arrangement, the detection unit 50 can include, for example, the reference plate 80, light sources 71 and 72, lenses 55 and 56, and a beam splitter 59. The reference plate 80 can be formed as shown in, for example, FIG. 2A. FIG. 2A is a view showing an example of the arrangement of the reference plate 80. The reference plate 80 can include, for example, the first marks 82U and the second marks 82D formed by the light-shielding members (for example, the Cr films) which shield light in partial regions (light-transmitting regions 82*a*) of the plate made of the light-transmitting member (for example, the glass member) which transmits light. A light-shielding region 82*b* is also provided on the reference plate 80 so as not to cause any influence in detecting the positions of the mask marks 12 and the substrate marks 22. Like the first marks 82U and the second marks 82D, the light-shielding region 82*b* is made of the light-shielding member which shields light.

Light (first light) emitted from the light source 72 (first light source) passes through the lens 56 and the beam splitter 59, and illuminates the first marks 82U on the reference plate 80. An optical system formed by the beam splitter 58, the relay lens 53, the beam splitter 57, the objective aperture 74, and the objective lens 51 forms the images of the illuminated first marks 82U in the light-shielding region 12*b* on the mask. On the other hand, light (second light) emitted from the light source 71 (second light source) passes through the lens 55, is reflected by the beam splitter 59, and illuminates the second marks 82D on the reference plate 80. The images of the illuminated second marks 82D are formed in the light-transmitting region 12*a* on the mask by the optical system and formed in the light-shielding region 22*b* on the substrate via the projection optical system 30. An optical system formed by the relay lens 52, the beam splitter 57, the objective aperture 74, and the objective lens 51 forms, on the imaging device, the images of the first marks formed on the mask and the images of the second marks formed on the substrate. The imaging device 60 captures, together with the mask marks 12 and the substrate marks 22, the first marks 82U whose images have been formed on the mask 11 and the second marks 82D whose images have been formed on the substrate 21. That is, the imaging device 60 can capture the first marks 82U formed on the reference plate 80 without intervening the projection optical system 30 and the second marks 82D via the projection optical system 30. FIG. 2D is a view showing an image 62 obtained by the imaging device 60. Patterns 62L and 62R in the image 62 correspond to the respective patterns 12R and 12L of the mask marks 12, and a pattern 62C in the image 62 corresponds to the pattern 22*c* of the substrate marks 22. Further, patterns 62U and 62D in the image 62 correspond to the first marks 82U and the second marks 82D, respectively.

The beam splitter 57 may have a function of the polarization beam splitter for the wavelength of the light source 71, in addition to the wavelength of the light source 70. This makes it possible to cause light from the light source 71 reflected by the substrate 21 to be incident on the imaging device 60 and cause the imaging device 60 to capture the second marks 82D whose images have been formed on the substrate. Further, the beam splitter 57 may have a function of a half mirror with respect to the wavelength of the light source 72. This is because light from the light source 72 has a polarization state unchanged from a time when emitted from the beam splitter 57 by being reflected by the mask 11 and incident on the beam splitter 57 without passing through the projection optical system 30. That is, this is because if the polarization beam splitter function with respect to the wavelength of the light source 72 is provided for the beam splitter 57, light from the light source 72 reflected by the mask is reflected by the beam splitter 57 and cannot be incident on the imaging device 60. As described above, the light source 71 and the light source 72 may be configured to emit light beams (the first light and the second light) having the different wavelengths, respectively.

In the first embodiment, the light source 72 for illuminating the first marks 82U and the light source 71 for illuminating the second marks 82D are provided separately. This is done for adjusting the intensity of light which illuminates the first marks 82U and the intensity of light which illuminates the second marks 82D individually such that the contrast between the first marks 82U and the second marks 82D in the image 62 obtained by the imaging device 60 falls within an allowable range. As described above, the light source 71 and the light source 72 may be configured to emit the light beams (the first light and the second light) having the different intensities, respectively. Note that the reference plate 80 may be illuminated by one light source as long as the intensity of light which illuminates the first marks 82U and the intensity of light which illuminates the second marks 82D can be adjusted individually.

Figure 3:
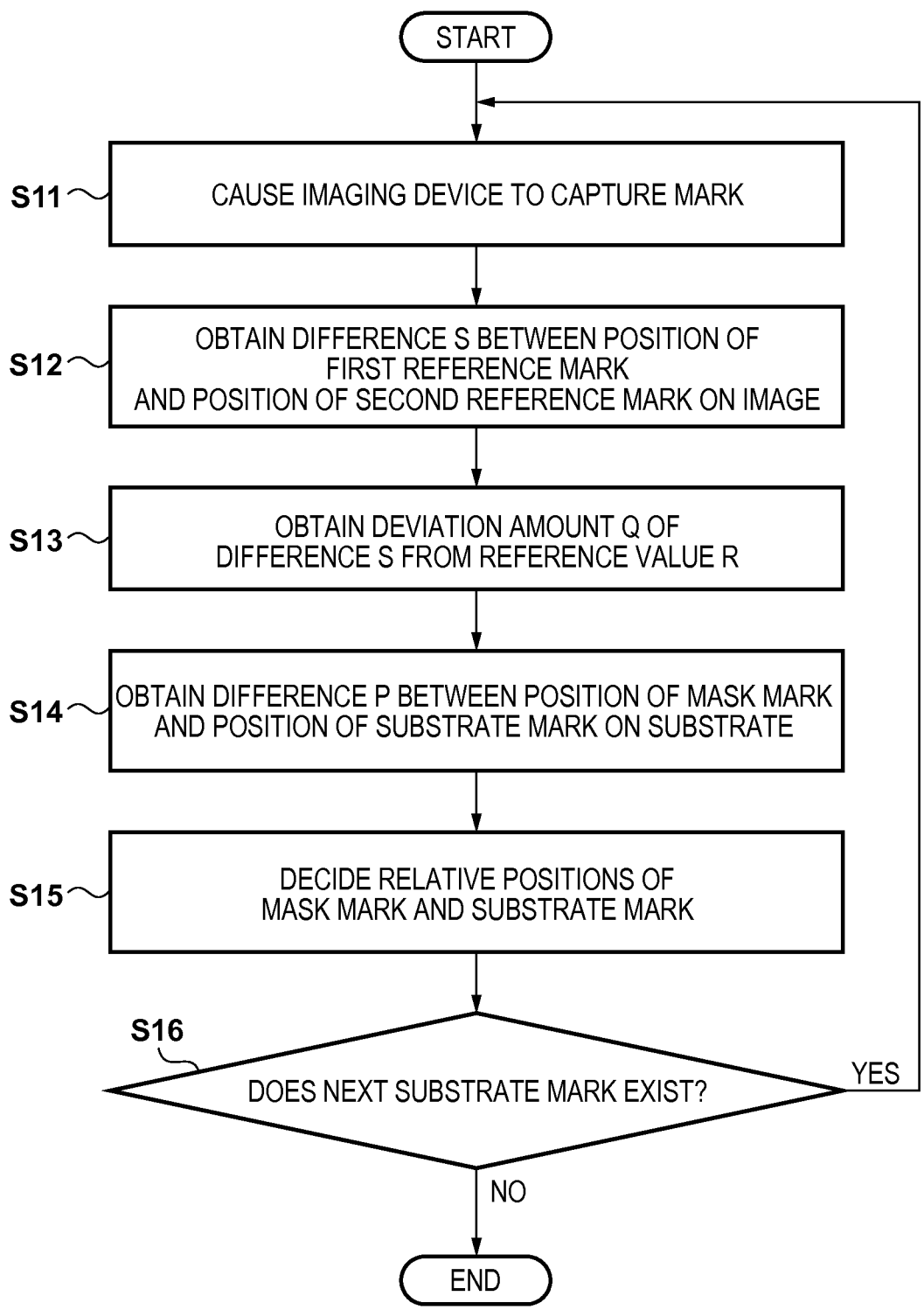
FIG. 3 is a flowchart showing a method of measuring the relative positions of the mask marks and the substrate marks.

A method of measuring the relative positions of the mask marks 12 and the substrate marks 22 by using the first marks 82U and the second marks 82D will now be described with reference to FIG. 3. FIG. 3 is a flowchart showing the method of measuring the relative positions of the mask marks 12 and the substrate marks 22. In the following description, the positions of the mask marks 12 on the image indicate, for example, an average value between the center of gravity (position) of the pattern 12R and the center of gravity (position) of the pattern 12L in the mask marks 12 on the image. Further, the positions of the substrate marks 22 on the image indicate, for example, the center of gravity (position) of the pattern 22*c* in the substrate marks 22.

In step S11, the controller 90 causes the imaging device 60 of the detection unit 50 to capture simultaneously (in parallel) the mask marks 12, the substrate marks 22, the first marks 82U whose images have been formed on the mask 11, and the second marks 82D whose images have been formed on the substrate 21. In step S12, the controller 90 obtains, from the image 62 obtained by the imaging device 60, a difference S between the position of each of the first marks 82U and the position of a corresponding one of the second marks 82D on the image. In step S13, the controller 90 obtains a deviation amount Q of the difference S obtained in step S12 from a reference value R (change amount (=R−S)). The reference value R refers to, for example, the difference between the position of each of the first marks 82U and the position of a corresponding one of the second marks 82D on the image obtained by the imaging device 60 when the projection optical system 30 is in a reference state, and can be decided in advance before starting the measurement of the relative positions. That is, the reference value R can be decided based on information on the initial relative positions of the first marks 82U and the second marks 82D on the image obtained by the imaging device 60. A method of deciding the reference value R will be described later. In step S14, the controller 90 obtains, from the image 62 obtained by the imaging device 60, a difference P between the position of each of the mask marks 12 and the position of a corresponding one of the substrate marks 22 on the image.

In step S15, the controller 90 subtracts the deviation amount Q obtained in step S13 from the difference P between the position of each mask mark 12 and the position of the corresponding substrate mark 22 on the image, and decides the relative positions of the mask marks 12 and the substrate marks 22 based on a value obtained by subtracting the deviation amount Q from the difference P. In step S16, the controller 90 determines whether there is the substrate mark 22 (next substrate mark 22) that should be detected by the detection unit 50 next. If the controller 90 determines that there is the next substrate mark 22, the process returns to step S11. If the controller 90 determines that there is no next substrate mark 22, the measurement of the relative positions of the mask marks 12 and the substrate marks 22 ends. This allows the controller 90 to obtain the relative positions of each of the plurality of substrate marks 22 and the corresponding one of the mask marks 12 under the assumption that the state of the projection optical system 30 is constant. Therefore, the controller 90 can obtain the information about arrangement of the shot regions accurately based on the relative position with respect to each of the plurality of substrate marks 22.

The method of deciding the reference value R will now be described. The controller 90 causes, for example, the imaging device 60 to capture the first marks 82U whose images have been formed on the mask and the second marks 82D whose images have been formed on the substrate before starting exposure processing on the substrate 21 such as immediately after starting up the exposure apparatus 100. Then, the controller 90 stores the information on the initial relative positions of the first marks 82U and the second marks 82D on the image obtained by the imaging device 60. This allows the controller 90 to obtain, based on the stored information, the difference between the position of each first mark 82U and the position of the corresponding second mark 82D on the image obtained by the imaging device 60, and decide the difference as the reference value R.

Note that as another method of deciding the reference value R, the reference value R may be decided by forming the images of both the first marks 82U and the second marks 82D on the mask, and capturing them by the imaging device 60. For example, before the start of exposure processing, the images of the first marks 82U and the second marks 82D are formed, by using the mask on which the light-shielding member is provided in both of the region on the mask where the images of the first marks 82U are formed and the region on the mask where the images of the second marks 82D are formed, on the mask. The controller 90 causes the imaging device 60 to capture both the first marks 82U and the second marks 82D whose images have been formed on the mask, and obtains the difference between the position of each first mark 82U and the position of the corresponding second mark 82D in the image obtained by the imaging device 60. This allows the controller 90 to decide the obtained difference as the reference value R.

As described above, the beam splitter 57 has a polarization beam splitter characteristic with respect to the wavelength of the light source 71. Therefore, light from the light source 71 reflected by the mask without passing through the projection optical system 30 is reflected by the beam splitter 57 and is not incident on the imaging device 60. That is, the imaging device 60 cannot capture the second marks 82D whose images have been formed on the mask. To solve this, in a method of forming the images of both the first marks 82U and the second marks 82D on the mask, the λ/4 plate may be inserted between the beam splitter 57 and the objective lens 51. This makes it possible to cause light from the light source 71 to be incident on the imaging device 60 and to capture the second marks 82D whose images have been formed on the mask by the imaging device 60.

Still another method of deciding the reference value R, the reference value R may be decided by forming the images of both the first marks 82U and the second marks 82D on the substrate, and capturing them by the imaging device 60. For example, before the start of exposure processing, the images of the first marks 82U and the second marks 82D are formed, by using the mask configured to transmit both light from the light source 71 and light from the light source 72, in the light-shielding region 22b on the substrate. The controller 90 causes the imaging device 60 to capture both the first marks 82U and the second marks 82D whose images have been formed on the substrate, and obtains the difference between the position of each first mark 82U and the position of the corresponding second mark 82D in the image obtained by the imaging device 60. This allows the controller 90 to decide the obtained difference as the reference value R.

As described above, in the exposure apparatus 100 according to the first embodiment, the reference plate 80 including the first marks 82U whose images are formed on the mask and the second marks 82D whose images are formed on the substrate is provided in the detection unit 50. The exposure apparatus 100 causes the imaging device 60 of the detection unit 50 to capture, together with the mask marks 12 and the substrate marks 22, the first marks 82U whose images have been formed on the mask and the second marks 82D whose images have been formed on the substrate. Then, the exposure apparatus 100 (controller 90) corrects the difference between the position of each mask mark 12 and the position of the corresponding substrate marks 22 in the image 62 obtained by the imaging device 60 with the deviation amount from the reference value of the difference between the position of each first mark 82U and the position of the corresponding second mark 82D in the image 62. This makes it possible to obtain the relative positions of each of the plurality of substrate marks 22 and the corresponding one of the mask marks 12 when the state of the projection optical system 30 is in the reference state, that is, under the assumption that the state of the projection optical system 30 is constant. Therefore, the exposure apparatus 100 can obtain the information about arrangement of the shot regions accurately even if the state of the projection optical system 30 changes while obtaining the relative position with respect to each of the plurality of substrate marks 22.

In the first embodiment, the example in which the mask marks 12 are provided on the mask and the substrate marks 22 are provided on the substrate has been described. However, the present invention is not limited to this. For example, the mask marks 12 may be provided on an original reference member mounted on the mask state and the substrate marks 22 may be provided on a substrate reference member mounted on the substrate stage.

Second Embodiment

If a temperature distribution occurs inside a projection optical system 30, a refractive index can be different in the positions of an optical path inside the projection optical system 30. Therefore, in the second embodiment, mask marks 12, substrate marks 22, first marks 82U, and second marks 82D are formed such that a region on an image where these marks are arranged becomes smaller than in the first embodiment. Note that an exposure apparatus according to the second embodiment has the same apparatus arrangement as the exposure apparatus 100 according to the first embodiment, and thus the description of the apparatus arrangement will be omitted below.

Figure 4B:
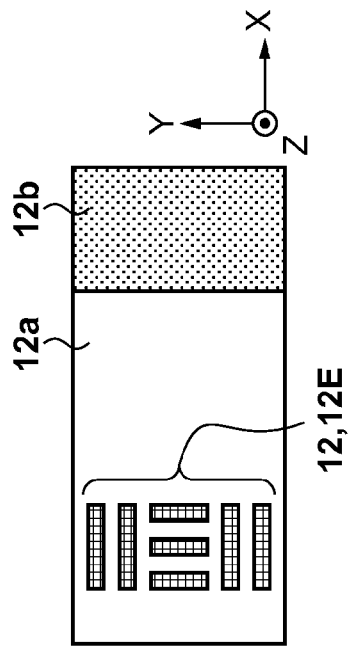
FIG. 4B is a view showing mask marks.
Figure 4A:
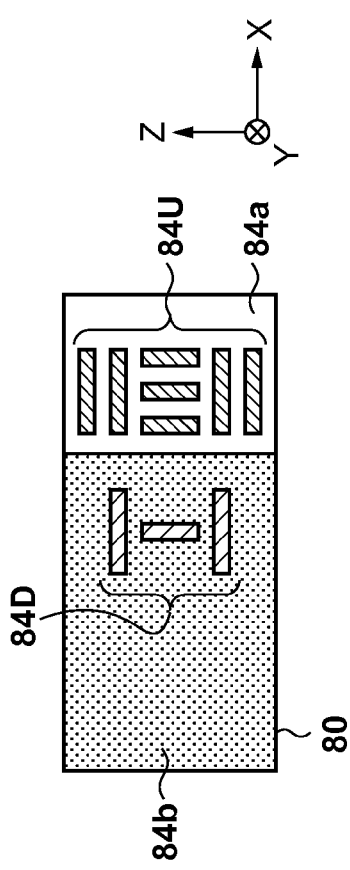
FIG. 4A is a view showing respective marks on a reference plate.

FIG. 4A is a view showing an example of the arrangement of a reference plate 80. The reference plate 80 can include, for example, first marks 84U formed by light-shielding members (for example, Cr films) which shield light in a partial region (light-transmitting region 84a) of the plate made of a light-transmitting member (for example, a glass member) which transmits light. Also, the reference plate 80 is provided with the light-shielding member in a region other than the light-transmitting region 84a (light-shielding region 84b) and includes second marks 84D formed by removing parts of the light-shielding region 84b. These second marks 84D are formed on the reference plate 80 such that their positions in an image 64 obtained by an imaging device 60 match the substrate marks 22. The second marks 84D can be formed on the reference plate 80 such that, for example, each pattern element of the second marks 84D and that of the substrate marks 22 do not overlap with each other, and the center of gravity of the second marks 84D and that of the substrate marks 22 coincide with each other in the image 64. That is, when the second marks 84D are aligned with the substrate marks 22, it can be formed on the reference plate 80 such that the images of the second marks 84D and those of the substrate marks 22 do not overlap with each other while the center of gravity of the images of the second marks 84D and that of the substrate marks 22 coincide with each other.

Figure 4D:
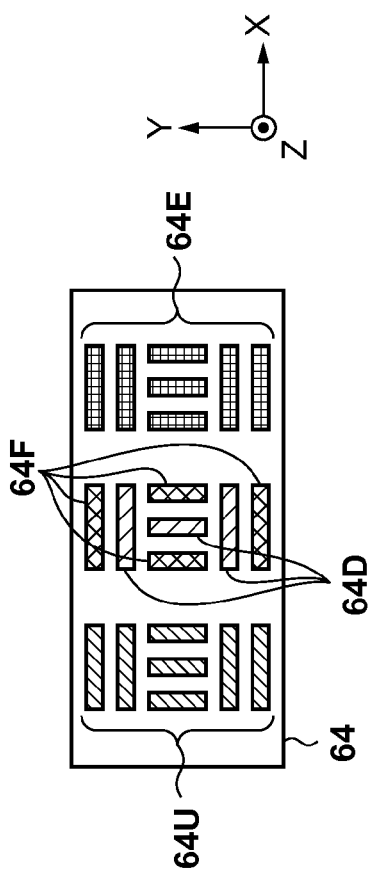
FIG. 4D is a view showing an image obtained by an imaging device.
Figure 4C:
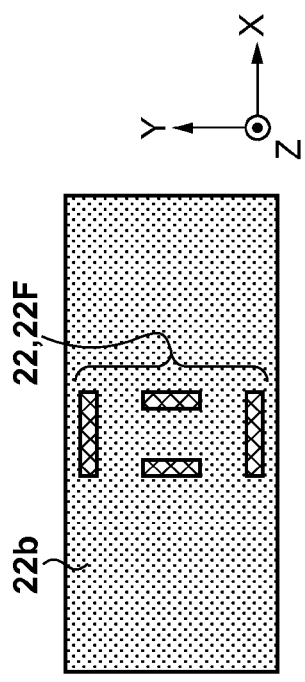
FIG. 4C is a view showing substrate marks.

FIGS. 4B and 4C respectively show the examples of the mask marks 12 and the substrate marks 22. As shown in FIG. 4B, the mask marks 12 can be formed by light-shielding members which shield light in, for example, a partial region (light-transmitting region 12a) on a mask made of the light-transmitting member (for example, the glass member) which transmits light. The mask marks 12 according to the second embodiment include a pattern 12E formed by the light-shielding member. A light-shielding region 12b where the images of first marks 84U on the reference plate 80 are to be formed is provided on the mask. Like the mask marks 12, the light-shielding region 12b is made of the light-shielding member which shields light. On the other hand, as shown in FIG. 4C, the substrate marks 22 are formed so as to transmit light by, for example, removing parts of a light-shielding member (light-shielding region 22b) which is provided on the substrate made of the light-transmitting member (for example, the glass member) transmitting light. The substrate marks 22 according to the second embodiment can include a pattern 22F formed by removing the light-shielding member.

FIG. 4D is a view showing the image 64 obtained by the imaging device 60. Pattern 64E in the image 64 corresponds to the pattern 12E of the mask marks 12 and a pattern 64F in the image 64 corresponds to the pattern 22F of the substrate marks 22. Further, patterns 64U and 64D in the image 64 correspond to the first marks 84U and the second marks 84D, respectively.

As described above, in the second embodiment, the substrate marks 22 and the second marks 84D are formed such that the positions of these marks match with each other in the image 64 obtained by the imaging device 60. This makes it possible to further reduce, even if the temperature distribution occurs inside the projection optical system 30, that effect as compared with the first embodiment. It is therefore possible in the second embodiment to obtain information about arrangement of shot regions more accurately than in the first embodiment.

Third Embodiment

If the telecentricity (the tilt angle of a principal ray with respect to an optical axis) of an optical system for forming the images of first marks 82U and second marks 82D on a mask and a substrate, respectively, is not zero, defocus may cause errors in detection results by a detection unit 50. A distortion may occur due to the influence of, for example, a variation in the thickness of a substrate 21 or the flatness of the holding surface of a substrate stage 20 which holds the substrate 21 especially on the surface of the substrate 21 where the images of the second marks 82D are formed. Consequently, the defocus arising from the distortion may cause errors in the detection results of the positions of the second marks 82D detected by the detection unit 50. To cope with this, an exposure apparatus 300 according to the third embodiment can include a first adjustment unit 172 configured to adjust the telecentricity of light (light from a light source 72) which forms the images of the first marks 82U on the mask. The exposure apparatus 300 can also include a second adjustment unit 171 configured to adjust the telecentricity of light (light from a light source 71) which forms the images of the second marks 82D on the mask. The exposure apparatus 300 according to the third embodiment is configured to include both the first adjustment unit 172 and the second adjustment unit 171. However, the exposure apparatus 300 may be configured to include at least one of the first adjustment unit 172 and the second adjustment unit 171. The telecentricity is also referred to as a degree of telecentricity.

Figure 5:
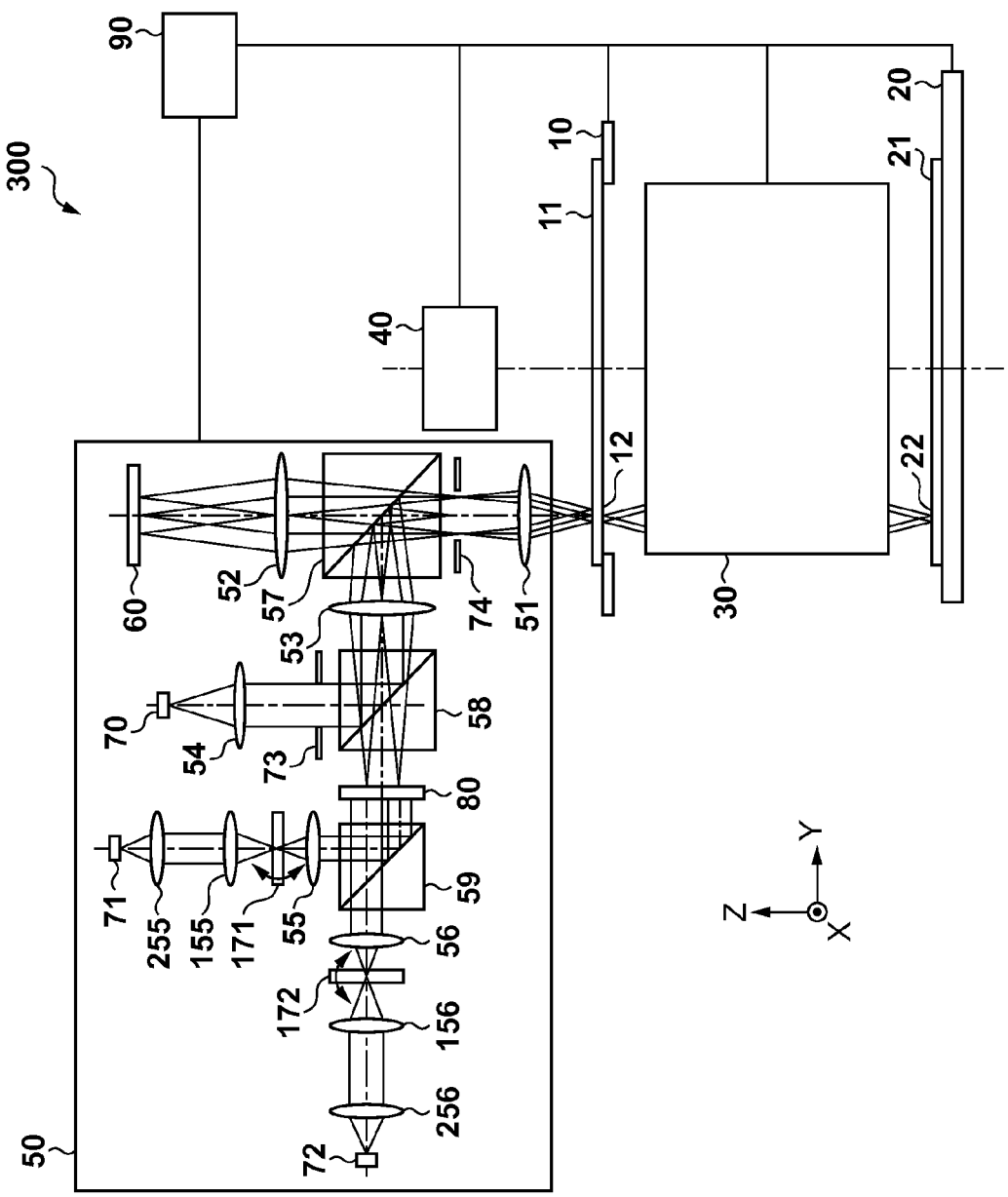
FIG. 5 is a schematic view showing the arrangement of an exposure apparatus according to the third embodiment.

FIG. 5 is a schematic view showing the arrangement of the exposure apparatus 300 according to the third embodiment. In the exposure apparatus 300 according to the third embodiment, a pupil plane in a conjugate relationship with objective aperture 74 is formed on an optical path between the light source 72 and a lens 56, and the first adjustment unit 172 is provided near the pupil plane. The pupil plane in the conjugate relationship with the objective aperture 74 is formed between the lens 56 and a lens 156 by providing, for example, the lens 156 and a lens 256 on the optical path between the light source 72 and the lens 56. Then, the first adjustment unit 172 can be provided near the pupil plane. Similarly, in the exposure apparatus 300, the pupil plane in a conjugate relationship with objective aperture 74 is formed on an optical path between the light source 71 and a lens 55, and the second adjustment unit 171 is provided near the pupil plane. The pupil plane in the conjugate relationship with the objective aperture 74 is formed between the lens 55 and a lens 155 by providing, for example, the lens 155 and a lens 255 on the optical path between the light source 71 and the lens 55. Then, the second adjustment unit 171 can be provided near the pupil plane.

The first adjustment unit 172 and the second adjustment unit 171 respectively include, for example, parallel plates, and can adjust the position of an effective light source on the objective aperture 74 by tilting them. As described above, each of the first adjustment unit 172 and the second adjustment unit 171 can adjust the telecentricity of the optical system by tilting the parallel plate in each adjustment unit to adjust the position of the effective light source. As a result, it is possible to reduce the errors caused by the defocus in the detection results by the detection unit 50. Note that the first adjustment unit 172 and the second adjustment unit 171 may be configured to include the parallel plate for adjusting the position of the effective light source in the X direction and the parallel plate for adjusting the position of the effective light source in the Y direction, respectively. The target value of the telecentricity (target telecentricity) may be the telecentricity of light which is emitted from a light source 70 to irradiate substrate marks 22 or a zero value. Further, an adjustment unit configured to adjust the telecentricity of light which is emitted from the light source 70 to irradiate the substrate marks 22 may be provided in the detection unit 50.

Fourth Embodiment

In the first embodiment, the example in which the reference value R of the difference S between each first mark 82U and the corresponding second mark 82D in the image 62 obtained by the imaging device 60 is decided in advance before starting exposure processing on the substrate 21 such as immediately after starting up the exposure apparatus 100 has been described. An exposure apparatus according to the fourth embodiment causes an imaging device 60 to capture each of a plurality of substrate marks 22 together with mask marks 12, first marks 82U, and second marks 82D. Then, an average value of the differences between the positions of the first marks 82U and the positions of the second marks 82D in a plurality of images 62 obtained by the imaging device 60 is set to a reference value R. Note that the exposure apparatus according to the fourth embodiment has the same apparatus arrangement of the exposure apparatus 100 according to the first embodiment, and thus the description of the apparatus arrangement will be omitted below.

Figure 6:
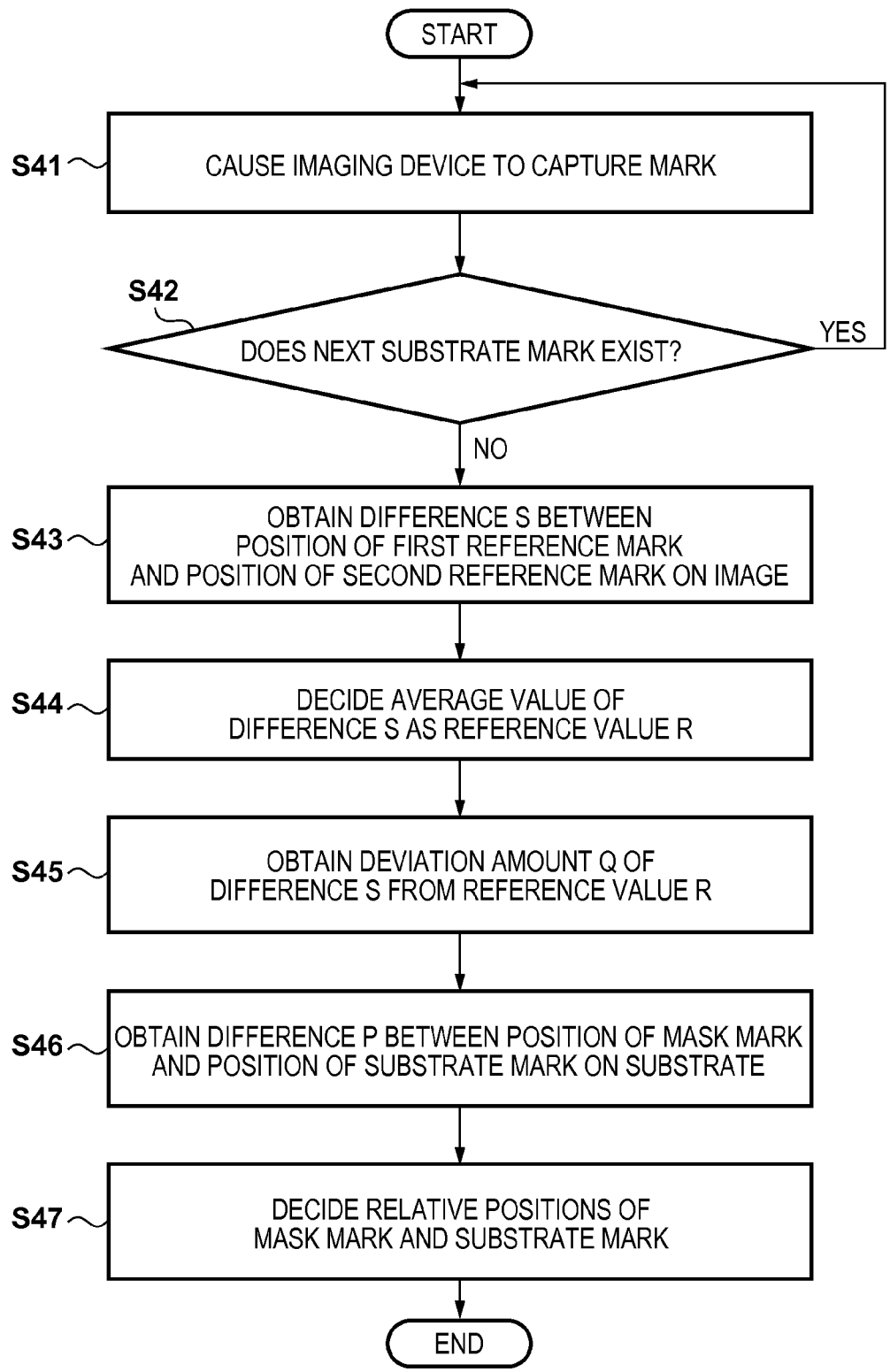
FIG. 6 is a flowchart showing a method of measuring the relative positions of mask marks and substrate marks.

In the fourth embodiment, a method of measuring the relative positions of the mask marks 12 and the substrate marks 22 will be described with reference to FIG. 6. FIG. 6 is a flowchart showing the method of measuring the relative positions of the mask marks 12 and the substrate marks 22. In step S41, a controller 90 causes the imaging device 60 of a detection unit 50 to simultaneously capture the mask marks 12, the substrate marks 22, the first marks 82U whose images have been formed on a mask 11, and the second marks 82D whose images have been formed on a substrate 21. In step S42, the controller 90 determines whether there is the substrate mark 22 (next substrate mark 22) that should be detected by the detection unit 50 next. If the controller 90 determines that there is the next substrate mark 22, the process returns to step S41. If the controller 90 determines that there is no next substrate mark 22, the process advances to step S43. In step S43, the controller 90 obtains, with respect to each of the plurality of images 62 obtained by the imaging device 60 by repeating steps S41 and S42, differences S between the positions of the first marks 82U and the positions of the second marks 82D on the respective images. For example, if the three images 62 are obtained by steps S41 and S42, the controller 90 can obtain differences S1, S2, and S3 from the respective images 62. In step S44, the controller 90 obtains the average value of the differences S obtained from the respective images 62 in step S43 and decides the average value as the reference value R. For example, if the three images 62 are obtained, the controller 90 decides, as the reference value R, an average value S' of the differences S1, S2, and S3 obtained from the respective images 62.

In step S45, the controller 90 obtains, with respect to each image 62, a deviation amount Q of the difference S obtained in step S43 from the reference value R (change amount (=R−S)). In step S46, the controller 90 obtains, with respect to each of the plurality of images 62 obtained by the imaging device 60, differences P between the positions of the mask marks 12 and the positions of the substrate marks 22 on the respective images. In step S47, the controller 90 subtracts, from the differences P between the positions of the mask marks 12 and the positions of the substrate marks 22 on the respective images, the deviation amounts Q obtained with respect to the respective images 62 in step S45. Then, the controller 90 decides, based on the values obtained by subtracting the deviation amounts Q from the differences P, the relative positions of the mask marks 12 and the substrate marks 22 with respect to the respective images 62. This allows the controller 90 to obtain the relative positions of each of the plurality of substrate marks 22 and a corresponding one of the mask marks 12 under the assumption that the state of a projection optical system 30 is constant. Therefore, the controller 90 can accurately obtain information about arrangement of shot regions based on the relative position with respect to each of the plurality of substrate marks 22.

Embodiment of Method of Manufacturing Article

A method of manufacturing an article according to an embodiment of the present invention is suitable for manufacturing an article, for example, an electronic device such as a semiconductor device or an element having a microstructure. The method of manufacturing the article according to this embodiment includes a step of forming a latent image pattern on a photoresist applied to a substrate using the above-described exposure apparatus (step of exposing the substrate) and a step of developing the substrate on which the latent image pattern has been formed in the preceding step. This manufacturing method further includes other known steps (oxidation, deposition, vapor deposition, doping, planarization, etching, resist peeling, dicing, bonding, packaging, and the like). The method of manufacturing the article according to this embodiment is advantageous in at least one of the performance, the quality, the productivity, and the production cost of the article, as compared with a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-181599 filed on Sep. 5, 2014, which is hereby incorporated by reference herein in its entirety.

What is claimed is:

1. A detection apparatus which detects an original mark on an original or an original reference member and a substrate mark on a substrate or a substrate reference member, the original mark and the substrate mark being arranged via a projection optical system, the apparatus comprising:
   an optical system including an imaging device and configured to form an image of the original mark and an image of the substrate mark onto the imaging device,
   wherein the optical system includes a detection reference member having a first mark and a second mark, and is configured to:
   form an image of the first mark onto the original or the original reference member, and form an image of the second mark onto the substrate or the substrate reference member via the projection optical system and the original or the original reference member, and
   form an image of the original mark, an image of the substrate mark, an image of the first mark, and an image of the second mark onto the imaging device.

2. The apparatus according to claim 1, wherein the optical system is configured to form the image of the first mark and the image of the second mark respectively using first light and second light wavelengths of which are different from each other.

3. The apparatus according to claim 1, wherein the optical system is configured to form the image of the first mark and the image of the second mark respectively using first light and second light intensities of which are different from each other.

4. The apparatus according to claim 2, further comprising a first light source configured to emit the first light and a second light source configured to emit the second light.

5. The apparatus according to claim 1, further comprising at least one of a first adjusting device configured to adjust telecentricity of light for forming the image of the first mark and a second adjusting device configured to adjust telecentricity of light for forming the image of the second mark.

6. The apparatus according to claim 1, wherein the second mark is formed in the detection reference member such that the image of the second mark and the image of the substrate mark do not overlap with each other and such that a center of gravity of the image of the second mark and a center of gravity of the image of the substrate mark coincide with each other, in a case where the second mark is aligned with the substrate mark.

7. The apparatus according to claim 1, wherein the imaging device is configured to take the image of the original mark, the image of the substrate mark, the image of the first mark, and the image of the second mark in parallel.

8. A measurement apparatus which measures relative positions between an original mark on an original or an original reference member and a substrate mark on a substrate or a substrate reference member, the apparatus comprising:
  a detection apparatus; and
  a controller configured to obtain the relative positions based on relative positions between an image of the first mark and an image of the second mark detected by the detection apparatus,
  wherein the detection apparatus detects an original mark on an original or an original reference member and a substrate mark on a substrate or a substrate reference member, the original mark and the substrate mark being arranged via a projection optical system, the detection apparatus comprising:
  an optical system including an imaging device and configured to form an image of the original mark and an image of the substrate mark onto the imaging device,
  wherein the optical system includes a detection reference member having a first mark and a second mark, and is configured to:
  form an image of the first mark onto the original or the original reference member, and form an image of the second mark onto the substrate or the substrate reference member via the projection optical system and the original or the original reference member, and
  form an image of the original mark, an image of the substrate mark, an image of the first mark, and an image of the second mark onto the imaging device.

9. The apparatus according to claim 8, wherein the controller is configured to obtain the relative positions between the original mark and the substrate mark based on a change amount of the relative positions between the image of the first mark and the image of the second mark.

10. The apparatus according to claim 9, wherein the controller is configured to store, in advance, information of initial relative positions between the image of the first mark and the image of the second mark.

11. An exposure apparatus which exposes a substrate to radiant energy via an original, the apparatus comprising:
  a projection optical system configured to project light from the original onto the substrate; and
  a measurement apparatus configured to measure relative positions between an original mark on an original or an original reference member and a substrate mark on a substrate or a substrate reference member, the measurement apparatus comprising:
  a detection apparatus; and
  a controller configured to obtain the relative positions based on relative positions between an image of the first mark and an image of the second mark detected by the detection apparatus,
  wherein the detection apparatus detects an original mark on an original or an original reference member and a substrate mark on a substrate or a substrate reference member, the original mark and the substrate mark being arranged via a projection optical system, the detection apparatus comprising:
  an optical system including an imaging device and configured to form an image of the original mark and an image of the substrate mark onto the imaging device,
  wherein the optical system includes a detection reference member having a first mark and a second mark, and is configured to:
  form an image of the first mark onto the original or the original reference member, and form an image of the second mark onto the substrate or the substrate reference member via the projection optical system and the original or the original reference member, and
  form an image of the original mark, an image of the substrate mark, an image of the first mark, and an image of the second mark onto the imaging device.

12. A method of manufacturing an article, the method comprising steps of:
  exposing a substrate to radiant energy using a exposure apparatus;
  developing the exposed substrate; and
  processing the developed substrate to manufacture the article,
  wherein the exposure apparatus exposes a substrate to radiant energy via an original, the exposure apparatus comprising:
  a projection optical system configured to project light from the original onto the substrate; and
  a measurement apparatus configured to measure relative positions between an original mark on an original or an original reference member and a substrate mark on a substrate or a substrate reference member, the measurement apparatus comprising:
  a detection apparatus; and
  a controller configured to obtain the relative positions based on relative positions between an image of the first mark and an image of the second mark detected by the detection apparatus,
  wherein the detection apparatus detects an original mark on an original or an original reference member and a substrate mark on a substrate or a substrate reference member, the original mark and the substrate mark being arranged via a projection optical system, the detection apparatus comprising:
  an optical system including an imaging device and configured to form an image of the original mark and an image of the substrate mark onto the imaging device, wherein the optical system includes a detection reference member having a first mark and a second mark, and is configured to:

form an image of the first mark onto the original or the original reference member, and form an image of the second mark onto the substrate or the substrate reference member via the projection optical system and the original or the original reference member, and form an image of the original mark, an image of the substrate mark, an image of the first mark, and an image of the second mark onto the imaging device.

13. A measurement method of measuring relative positions between an original mark on an original or an original reference member and a substrate mark on a substrate or a substrate reference member, the original mark and the substrate mark being arranged via a projection optical system, the method comprising steps of:

forming an image of a first mark onto the original or the original reference member, and forming an image of a second mark onto the substrate or the substrate reference member via the projection optical system and the original or the original reference member;

forming an image of the original mark, an image of the substrate mark, an image of the first mark, and an the image of the second mark onto a plane; and obtaining the relative positions based on relative positions between the image of the first mark and the image of the second mark on the plane.

* * * * *